United States Patent
Jung et al.

(10) Patent No.: US 10,021,794 B2
(45) Date of Patent: Jul. 10, 2018

(54) DISPLAY DEVICE

(71) Applicant: LG Display Co., Ltd., Seoul (KR)

(72) Inventors: Jin-Hyun Jung, Seoul (KR); BuYeol Lee, Goyang-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 15/346,096

(22) Filed: Nov. 8, 2016

(65) Prior Publication Data
US 2017/0164485 A1   Jun. 8, 2017

(30) Foreign Application Priority Data

Dec. 7, 2015 (KR) ........................ 10-2015-0173087

(51) Int. Cl.
| | | |
|---|---|---|
| H05K 5/00 | (2006.01) | |
| H01L 51/52 | (2006.01) | |
| H05K 1/02 | (2006.01) | |
| H05K 1/14 | (2006.01) | |
| G02F 1/1345 | (2006.01) | |
| H05K 3/36 | (2006.01) | |

(52) U.S. Cl.
CPC ....... H05K 5/0017 (2013.01); G02F 1/13452 (2013.01); H01L 51/52 (2013.01); H01L 51/5237 (2013.01); H05K 1/0274 (2013.01); H05K 1/14 (2013.01); H05K 1/144 (2013.01); H05K 3/363 (2013.01); *G02F 2203/01* (2013.01); *H05K 2201/0108* (2013.01); *H05K 2201/041* (2013.01); *H05K 2201/056* (2013.01); *H05K 2201/10128* (2013.01); *H05K 2201/10681* (2013.01)

(58) Field of Classification Search
USPC .......................................... 345/691
See application file for complete search history.

(56) References Cited

U.S. PATENT DOCUMENTS

| | | | | |
|---|---|---|---|---|
| 5,838,416 | A * | 11/1998 | Chen .................... | G02F 1/13471 349/202 |
| 2003/0029559 | A1* | 2/2003 | Yamada ..................... | C09J 9/00 156/307.7 |
| 2010/0309236 | A1* | 12/2010 | Min ..................... | G09G 3/3648 345/691 |
| 2012/0075268 | A1 | 3/2012 | Chung et al. | |
| 2013/0207948 | A1 | 8/2013 | Na et al. | |
| 2014/0113463 | A1* | 4/2014 | Peterson ................ | H01R 12/73 439/77 |

* cited by examiner

*Primary Examiner* — William H Mayo, III
*Assistant Examiner* — Krystal Robinson
(74) *Attorney, Agent, or Firm* — Dentons US LLP

(57) ABSTRACT

Disclosed is a display device for realizing a transparent image. The display device includes a display panel, a source printed circuit board (PCB) on which a signal line is mounted, a control PCB on which a timing controller is mounted, and a circuit film connected to the display panel at one side of the circuit film and connected to the source PCB at another side. The source PCB and the control PCB are disposed to overlap each other.

4 Claims, 5 Drawing Sheets

DISPLAY DEVICE

CROSS-REFERENCE TO RELATED APPLICATIONS

This application claims the benefit of Korean Patent Application No. 10-2015-0173087 filed on Dec. 7, 2015, which is hereby incorporated by reference as if fully set forth herein.

BACKGROUND

Field of the Invention

The present invention relates to a display device and a method of manufacturing the same, and more particularly, to a transparent display device.

Discussion of the Related Art

Recently, as the information-oriented society advances, the display field of processing and displaying massive amount of information is rapidly advancing, and various types of flat panel display (FPD) devices have been developed and are attracting much attention. FPD devices include liquid crystal display (LCD) devices, plasma display panel (PDP) devices, field emission display (FED) devices, electroluminescence display (ELD) devices, and organic light emitting diode (OLED) display devices, etc.

FPD devices are now manufactured with a slim profile and lightweight design and low power consumption, and thus, the application field of display devices is continuously increasing. Particularly, display devices are now used for a user interface in most electronic devices and mobile devices, etc.

Transparent display devices, which enable a user to see a background or an object disposed on a rear surface thereof, are being actively researched recently. The transparent display devices are good in space availability, interior and design, and can thus be applied to various fields. The transparent display devices realize an information recognition function, an information processing function, and an information display function by using a transparent electronic device, thereby solving the spatial limitation and visual limitation of electronic devices. For example, a transparent display device may be applied to windows of buildings or vehicles and thus may be implemented as a smart window which allows a background to be seen or displays an image.

However, in order for the transparent display device to realize a transparent image, a driving circuit unit is beneficially not to be disposed on a rear surface of the transparent display device. To this end, the driving circuit unit may be disposed in another area except an active area which displays an image, causing an increase in the bezel of the transparent display device.

FIG. 1 is a diagram illustrating a backside of a related art display device. FIG. 2 is a cross-sectional view of the related art display device.

Referring to FIGS. 1 and 2, the related art display device includes a display panel 11, a circuit film 12, a source printed circuit board (PCB) 13, a connection part 14, and a control PCB 16.

The display panel 11 may be a liquid crystal display panel, an organic light emitting display panel, or a transparent display panel. If the display panel 11 is the transparent display panel, the display panel 11 may include a transmissive area and a display area.

The source PCB 13 is connected to a plurality of circuit films 12 to transfer a signal for displaying an image to the display panel 11.

The control PCB 16 is connected to the source PCB 13 through the connection part 14 and transfers a driving signal, supplied from a timing controller (not shown) mounted on the control PCB 16, to the source PCB 13.

In order for the display device to act as a transparent display device that realizes a transparent image, a driving circuit unit is beneficially not to be disposed on a rear surface of the display panel 11.

However, as illustrated in FIG. 2, as the control PCB 16, the source PCB 13, and driving circuits are arranged in parallel on the rear surface of the display panel 11, the display device according to the related art may not realize a transparent image.

SUMMARY

Accordingly, the present invention is directed to provide a display device and a method for manufacturing the same that substantially obviate one or more problems due to limitations and disadvantages of the related art.

An aspect of the present invention is directed to provide a display device in which a disposed position of a driving circuit unit is changed, thereby realizing a transparent image.

Another aspect of the present invention is directed to provide a display device in which the number of elements included in a driving circuit unit connected to a display panel is reduced, and a thickness is reduced, thereby enhancing a sense of beauty.

Additional advantages and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these and other advantages and in accordance with the purpose of the invention, as embodied and broadly described herein, a display device may, for example, include a display panel, a source printed circuit board (PCB) on which a signal line is mounted, a control PCB on which a timing controller is mounted, and a circuit film connected to the display panel at one side of the circuit film and connected to the source PCB at another side, wherein the source PCB and the control PCB are disposed to overlap each other.

In another aspect, a display device may, for example, include a display panel; a printed circuit board (PCB); a circuit film connected to the display panel at one side of the circuit film and connected to the PCB at another side, wherein the PCB comprises a first surface, on which a plurality of circuit wirings are mounted, and a second surface on which the timing controller is mounted.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings.

DETAILED DESCRIPTION OF THE ILLUSTRATED EMBODIMENTS

Figure 1:
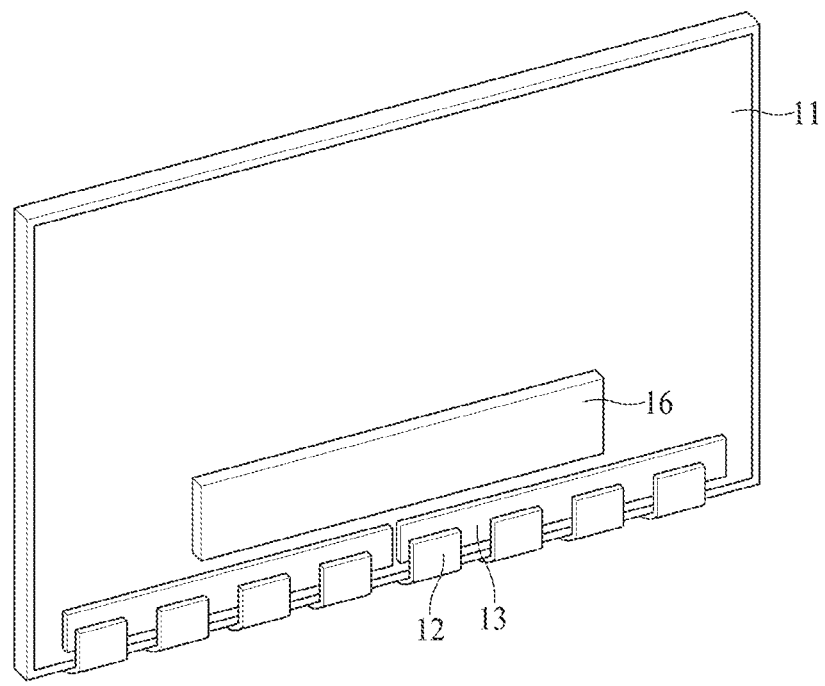
FIG. 1 is a diagram illustrating a backside of a related art display device.
Figure 2:
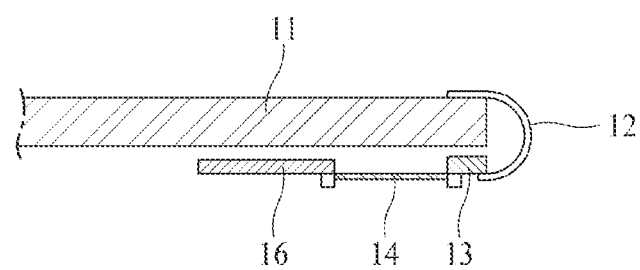
FIG. 2 is a cross-sectional view of a driving circuit unit included in the related art display device.

Reference will now be made in detail to the exemplary embodiments of the present invention, examples of which are illustrated in the accompanying drawings. Wherever possible, the same reference numbers will be used throughout the drawings to refer to the same or like parts.

Advantages and features of the present invention, and implementation methods thereof will be clarified through following embodiments described with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Further, the present invention is only defined by scopes of claims.

A shape, a size, a ratio, an angle, and a number disclosed in the drawings for describing embodiments of the present invention are merely an example, and thus, the present invention is not limited to the illustrated details. Like reference numerals refer to like elements throughout. In the following description, when the detailed description of the relevant known function or configuration is determined to unnecessarily obscure the important point of the present invention, the detailed description will be omitted. In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when a position relation between two parts is described as 'on~', 'over~', 'under~', and 'next~', one or more other parts may be disposed between the two parts unless 'just' or 'direct' is used.

In describing a time relationship, for example, when the temporal order is described as 'after~', 'subsequent~', 'next~', and 'before~' a case which is not continuous may be included unless 'just' or 'direct' is used.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present invention.

Features of various embodiments of the present invention may be partially or overall coupled to or combined with each other, and may be variously inter-operated with each other and driven technically as those skilled in the art can sufficiently understand. The embodiments of the present invention may be carried out independently from each other, or may be carried out together in co-dependent relationship.

Hereinafter, embodiments of the present invention will be described in detail with reference to the accompanying drawings.

Figure 3:
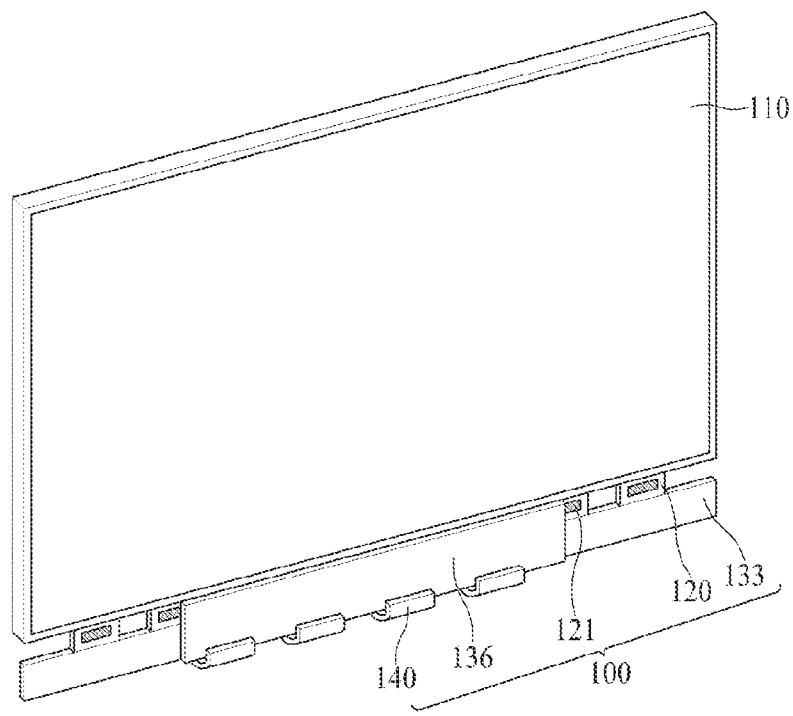
FIG. 3 is a diagram illustrating a backside of a display device according to a first embodiment of the present invention.
Figure 4:
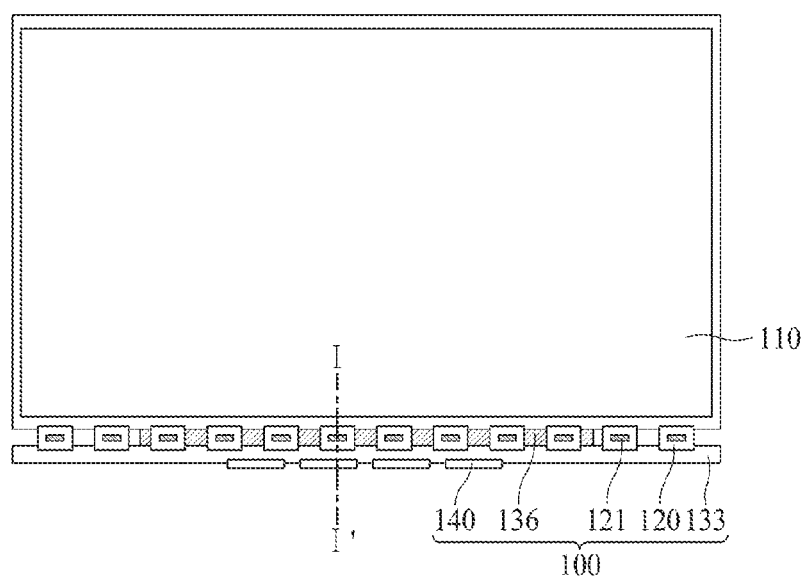
FIG. 4 is a front view of the display device according to the first embodiment of the present invention.
Figure 5:
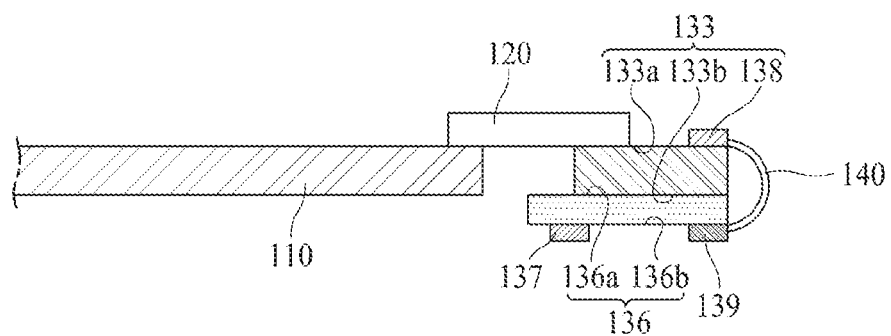
FIG. 5 is a cross-sectional view taken along line I-I' of FIG. 4.

FIG. 3 is a diagram illustrating a backside of a display device according to a first embodiment of the present invention. FIG. 4 is a front view of the display device according to the first embodiment of the present invention. FIG. 5 is a cross-sectional view taken along line I-I' of FIG. 4.

Referring to FIGS. 3 to 5, the display device according to the first embodiment of the present invention may include a display panel 110 and a driving circuit unit 100. In more detail, the driving circuit unit 100 according to the first embodiment of the present invention may include a circuit film 120, a source printed circuit board (PCB) 133, a control PCB 136, and a connection part 140.

The display panel 110 may be a liquid crystal display panel, an organic light emitting display panel, or a transparent display panel. If the display panel 110 according to the first embodiment of the present invention is the transparent display panel, the display panel 110 may be the transparent display panel that includes a plurality of transmissive areas, through which incident light passes, and a plurality of display areas that display an image.

Moreover, if the display panel 110 is a transparent organic light emitting display panel, the display panel 110 may additionally include a substrate, a thin film transistor (TFT) layer, an organic emission layer, and an encapsulation layer. Also, the display panel 110 may further include a light shield film for effectively controlling light.

The circuit film 120 may include one side, connected to a lower end edge of the display panel 110, and another side connected to the source PCB 133. The circuit film 120 may be provided in plurality. A plurality of drive integrated circuits (ICs) 121 for transmitting various driving signals, control signals, and image data signals to the display panel 110 may be mounted on the plurality of circuit films 120, respectively. The circuit films 120 may be connected to the source PCB 133 in a tape carrier package (TCP) type or a chip-on film (COF) type.

The drive ICs 121 may each be a gate drive IC or a data drive IC, or may be an integrated drive IC for performing two functions, namely, a function of the gate drive IC and a function of the data drive IC. For example, the data drive IC may receive pixel-based pixel data and a data control signal supplied from a timing controller 137, convert the pixel-based pixel data into an analog data signal according to the data control signal, and supply the analog data signal to a corresponding data line of the display panel 110.

The source PCB 133 may include a first surface 133*a* connected to the circuit film 120, a second surface 133*b* which is disposed on the reverse of the first surface 133*a*, and a first connector 138. The source PCB 133 may be connected to a plurality of flexible circuit films 120 and may supply a signal, used to display an image on each of a plurality of pixels provided in the display panel 110, to the data drive IC 121. To this end, various signal lines, various power circuits, and a memory device may be mounted on the source PCB 133.

The control PCB 136 may include a second surface 136*b*, which is electrically connected to the source PCB 133 through a second connector 139, and a first surface 136*a* which is disposed on the reverse of the second surface 136*b*. The timing controller 137 and the second connector 139 are mounted on the second surface 136*b* of the control PCB 136, A user connector (not shown) may be mounted on the control PCB 136, and thus, an image signal, a timing synchronization signal, and a driving power may be applied through the user connector from an external host system (not shown).

The timing controller 137 may align digital image data, input from a driving system, according to a pixel arrangement structure of the display panel 110 to generate pixel-based pixel data, in response to the timing synchronization signal supplied through the user connector from the external host system (not shown). The timing controller 137 may supply the generated pixel-based pixel data to the data drive ICs 121.

Moreover, the timing controller 137 may generate a data control signal and a gate control signal based on the timing synchronization signal to control a driving timing of the data drive IC or the gate drive IC (not shown).

The connection part 140 may electrically connect with the source PCB 133 and the control PCB 136. In this case, the connection part 140 may be a flexible printed circuit or a flexible flat cable.

In the display device according to the first embodiment of the present invention, the source PCB 133 may contact the control PCB 136. Referring to the cross-sectional view illustrated in FIG. 5, the circuit film 120 may be connected to a lower end of the display panel 110 at one end of the circuit film 120 without being bent, and may be connected to the source PCB 133 at the other end. In this case, the source PCB 133 and the control PCB 136 may be disposed to overlap each other, and may be disposed not to overlap the display panel 110. Also, the second surface 133*b* of the source PCB 133 and the first surface 136*a* of the control PCB 136 may be disposed to contact each other and may be electrically connected to each other through the connection part 140.

A thickness of the display device according to the first embodiment of the present invention is further reduced than a related art display device having a structure where the source PCB 133 and the control PCB 136 are disposed in parallel.

In the related art display device, a portion of the source PCB 133 and the control PCB 136 are disposed in an area overlapping the display panel 110, and for this reason, a thickness of a cover (not shown) accommodating the display panel 110 increases for accommodating a portion of the source PCB 133 and the control PCB 136.

However, according to the first embodiment of the present invention, since the source PCB 133 and the control PCB 136 overlap each other and are not disposed in an area overlapping the display panel 110, a thickness of the display device is reduced by a thickness of a cover accommodating the display panel 110. In this manner, according to the first embodiment of the present invention, since a thickness is reduced, a display device with enhanced aesthetic appearance is implemented.

In addition, if the display panel 110 included in the display device according to the first embodiment of the present invention is a transparent display panel, the source PCB 133 and the control PCB 136 may not be disposed on a rear surface overlapping the display panel 110, thereby realizing a transparent image.

Figure 6:
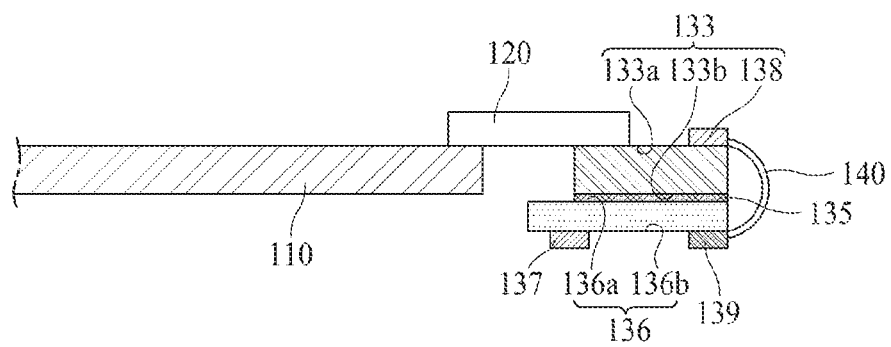
FIG. 6 is a cross-sectional view of a display device according to a second embodiment of the present invention.

FIG. 6 is a cross-sectional view of a display device according to a second embodiment of the present invention. The display device according to the second embodiment of the present invention may be implemented by modifying some elements of the display device according to the first embodiment of the present invention illustrated in FIGS. 3 to 5, and thus, descriptions of repetitive elements are omitted.

Referring to FIG. 6, the display device according to the second embodiment of the present invention may include a display panel 110, a circuit film 120, a source PCB 133, a control PCB 136, a connection part 140, and an insulation tape 135.

The circuit film 120 may be connected to a lower end of the display panel 110 at one end of the circuit film 120 without being bent, and may be connected to the source PCB 133 at the other end. In this case, the source PCB 133 and the control PCB 136 may be disposed to overlap each other, and may be disposed not to overlap the display panel 110. Also, a second surface 133*b* of the source PCB 133 and a first surface 136*a* of the control PCB 136 may be disposed to contact each other and may be electrically connected to each other through the connection part 140.

Here, an electrical contact defect may occur due to short circuit of small circuit elements between a surface where the second surface 133*b* of the source PCB 133 contacts the first surface 136*a* of the control PCB 136. Therefore, the display device according to the second embodiment of the present invention may further include the insulation tape 135 which is disposed on the surface where the second surface 133*b* of the source PCB 133 contacts the first surface 136*a* of the control PCB 136.

The insulation tape 135 prevents a contact between circuit elements, mounted on the second surface 133*b* of the source PCB 133, and circuit elements mounted on the first surface 136*a* of the control PCB 136, thereby preventing an electrical contact defect from occurring due to short circuit.

Moreover, a thickness of the display device according to the second embodiment of the present invention is further reduced than the related art display device having a structure where the source PCB 133 and the control PCB 136 are disposed in parallel, thereby providing a display device with enhanced aesthetic appearance. In addition, if the display panel 110 is a transparent display panel, the source PCB 133 and the control PCB 136 may not be disposed on a rear surface overlapping the display panel 110, thereby realizing a transparent image.

Figure 7:
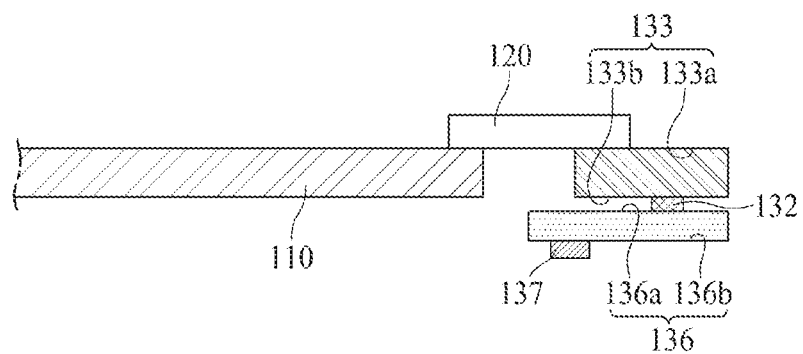
FIG. 7 is a cross-sectional view of a display device according to a third embodiment of the present invention.

FIG. 7 is a cross-sectional view of a display device according to a third embodiment of the present invention. The display device according to the third embodiment of the present invention may be implemented by modifying some elements of the display device according to the first embodiment of the present invention illustrated in FIGS. 3 to 5, and thus, descriptions of repetitive elements are omitted.

Referring to FIG. 7, the display device according to the third embodiment of the present invention may include a display panel 110, a circuit film 120, a source PCB 133, a control PCB 136, and a board-to-board (BTB) connector 132.

The circuit film 120 may be connected to a lower end of the display panel 110 at one end of the circuit film 120 without being bent, and may be connected to the source PCB 133 at the other end. In this case, the source PCB 133 and the control PCB 136 may be disposed to overlap each other, and may be disposed not to overlap the display panel 110. Also, a second surface 133b of the source PCB 133 and a first surface 136a of the control PCB 136 may be disposed to contact each other and may be electrically connected to each other through the BTB connector 132.

The source PCB 133 and the control PCB 136 may be electrically connected to each other by the BTB connector 132. The BTB connector 132 may include a plurality of ports that connect two circuit boards, and a conductive pattern electrically connected to each of the plurality of ports may be provided on a surface of the BTB connector 132.

In the display device including the BTB connector 132 according to the third embodiment of the present invention, the first connector 138 mounted on a first surface 133a of the source PCB 133, the second connector 139 mounted on the second surface 133b of the source PCB 133, and the connection part 140 may be removed, thereby reducing the manufacturing cost and the material cost and simplifying a manufacturing process.

Likewise with the first embodiment and the second embodiment, a thickness of the display device according to the third embodiment of the present invention is reduced, and particularly, a thickness is additionally reduced by removing the connectors. In detail, the first connector and the second connector may be disposed in a bezel of the display device, and a thickness of a lower end bezel of the display device is reduced by removing the first connector and the second connector.

In addition, if the display panel 110 is a transparent display panel, the source PCB 133 and the control PCB 136 may not be disposed on a rear surface of the transparent display panel, and thus, a transparent image is more easily realized.

Figure 8:
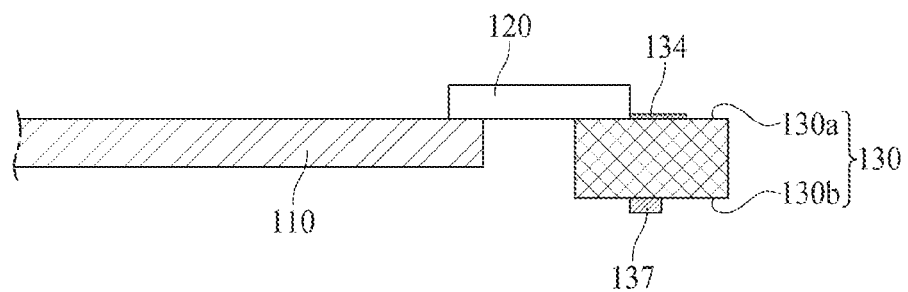
FIG. 8 is a cross-sectional view of a display device according to a fourth embodiment of the present invention.

FIG. 8 is a cross-sectional view of a display device according to a fourth embodiment of the present invention. The display device according to the fourth embodiment of the present invention may be implemented by modifying some elements of the display device according to the first embodiment of the present invention illustrated in FIGS. 3 to 5, and thus, descriptions of repetitive elements are omitted.

Referring to FIG. 8, the display device according to the fourth embodiment of the present invention may include a display panel 110, a circuit film 120, and a PCB 130.

The PCB 130 may include a first surface 130a connected to the circuit film 120, a second surface 130b disposed on the reverse of the first surface 130a, a circuit wiring 134, and a timing controller 137. In the fourth embodiment, the PCB 130 may have a structure where the source PCB 133 and the control PCB 136 according to the first to third embodiments are integrated.

The circuit wiring 134, various power circuits, and a memory device disposed on the source PCB 133 according to the first to third embodiment of the present invention may be disposed on the first surface 130a of the PCB 133.

Moreover, the timing controller 137 disposed on the control PCB 136 according to the first to third embodiment of the present invention may be mounted on the second surface 130b of the PCB 130.

In the display device according to the fourth embodiment of the present invention where the source PCB 133 and the control PCB 136 are integrated into one the PCB 130, one integrated process may be performed unlike a related art process of separately manufacturing two the circuit boards 133 and 136, thereby simplifying a manufacturing process and reducing the manufacturing cost and the material cost.

Moreover, according to the fourth embodiment of the present invention, since the source PCB 133 and the control PCB 136 are not disposed in an area overlapping the display panel 110, a thickness of the display device is reduced by a thickness of a cover accommodating the display panel 110.

In addition, if the display panel 110 included in the display device according to the fourth embodiment of the present invention is a transparent display panel, the source PCB 133 and the control PCB 136 may not be disposed on a rear surface overlapping the display panel 110, thereby realizing a transparent image.

Figure 9:
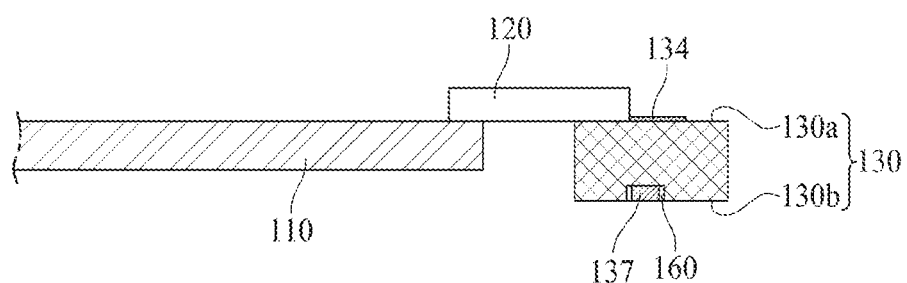
FIG. 9 is a cross-sectional view of a display device according to a fifth embodiment of the present invention.

FIG. 9 is a cross-sectional view of a display device according to a fifth embodiment of the present invention.

As seen in FIG. 9, the display device according to the fifth embodiment of the present invention may include a circuit film 120 and a PCB 130. The PCB 130 according to the fifth embodiment of the present invention may include a first surface 130a connected to the circuit film 120, a second surface 130b disposed on the reverse of the first surface 130a, a circuit wiring 134, and a timing controller 137.

The PCB 130 may have a structure where the source PCB 133 and the control PCB 136 according to the first to third embodiments are integrated. In addition, the PCB 130 may further include a groove 160 structure provided in the second surface 130b.

The groove 160 structure denotes a recessed portion which enables the timing controller 137 to be disposed on the second surface 130b of the PCB 130. The timing controller 137 may be disposed in the groove 137 structure, thereby contributing to reduce a thickness of the display device.

Since the timing controller 137 is larger in size than other circuit elements generally, a thickness of a cover (not shown) accommodating the control PCB 136 with the timing controller 137 mounted thereon should be maintained as a certain thickness or more. Therefore, when the timing controller 137 is buried by using the groove 160 structure, a thickness of a cover accommodating the PCB 130 is reduced.

According to the fifth embodiment of the present invention, in addition to a transparent image being realized as in the first to fourth embodiments, a thickness is reduced, and thus, a display device with enhanced aesthetic appearance is implemented.

Figure 10:
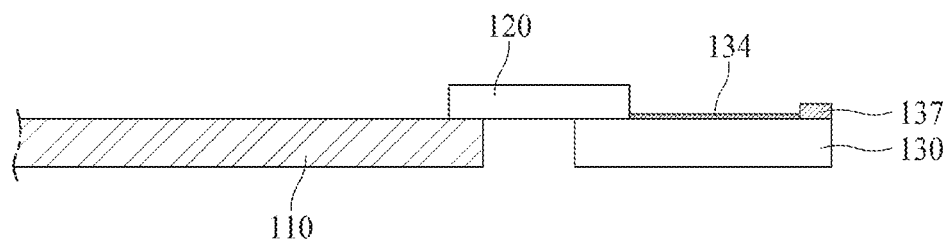
FIG. 10 is a cross-sectional view of a display device according to a sixth embodiment of the present invention.

FIG. 10 is a cross-sectional view of a display device according to a sixth embodiment of the present invention. The display device according to the sixth embodiment of the present invention may be implemented by modifying some elements of the display device according to the first embodiment of the present invention illustrated in FIGS. 3 to 5, and thus, descriptions of repetitive elements are omitted.

Referring to FIG. 10, the display device according to the sixth embodiment of the present invention may include a display panel 110, a circuit film 120, and a PCB 130.

As seen in FIG. 10, the PCB 130 may include a circuit wiring 134 and a timing controller 137 which are disposed on the same surface as a surface connected to the circuit film 120. That is, the PCB 130 may have a structure where the source PCB 133 and the control PCB 136 according to the first to third embodiments are integrated into one PCB.

Therefore, the circuit wiring 134 disposed on the source PCB 133, various power circuits, and a memory device may be mounted on the PCB 130 according to the sixth embodiment of the present invention, and the timing controller 137 may be mounted on the same surface. Accordingly, the circuit wiring 134 may be directly and electrically connected to the timing controller 137.

As described above, a thickness of the display device according to the sixth embodiment of the present invention is further reduced than the related art display device having a structure where the source PCB 133 and the control PCB 136 are disposed in parallel, thereby providing a display device with enhanced aesthetic appearance. Also, if the display panel 110 is a transparent display panel, the source PCB 133 and the control PCB 136 may not be disposed on a rear surface of the transparent display panel, and thus, a transparent image is more easily realized.

In addition, since the source PCB 133 and the control PCB 136 are integrated into one the PCB 130, the manufacturing process is simplified.

As described above, since the driving circuit unit is disposed outside the active area, the display device according to the embodiments of the present invention realizes a transparent image.

Moreover, according to the embodiments of the present invention, a thickness of a bezel is reduced, thereby providing a display device with enhanced aesthetic appearance.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A display device comprising:
   a display panel;
   a printed circuit board (PCB);
   a circuit film connected to the display panel at one side of the circuit film and connected to the PCB at another side,
   wherein the PCB comprises a first surface, on which a plurality of circuit wirings are mounted, and a second surface on which the timing controller is mounted,
   the first surface of the PCB is disposed on a reverse of the second surface, and
   the PCB further comprises a groove provided in the second surface of the PCB, the timing controller being mounted into the groove.

2. The display device of claim 1, wherein the first surface and the second surface of the PCB are disposed on the same surface.

3. The display device of claim 1, wherein the PCB is disposed not to overlap the display panel.

4. The display device of claim 1, wherein the display panel is a transparent organic light emitting display panel that includes a plurality of transmissive areas, through which incident light passes, and a plurality of emissive areas emitting light.

* * * * *